(12) United States Patent
Lee (10) Patent No.: US 8,319,324 B2
(45) Date of Patent: *Nov. 27, 2012

(54) HIGH I/O SEMICONDUCTOR CHIP PACKAGE AND METHOD OF MANUFACTURING THE SAME

(75) Inventor: Jong-Joo Lee, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 457 days.

This patent is subject to a terminal disclaimer.

(21) Appl. No.: 11/950,990

(22) Filed: Dec. 5, 2007

(65) Prior Publication Data

US 2008/0128883 A1 Jun. 5, 2008

(30) Foreign Application Priority Data

Dec. 5, 2006 (KR) .................. 10-2006-0122588

(51) Int. Cl.
*H01L 23/36* (2006.01)
(52) U.S. Cl. .................. 257/686; 257/E23.101
(58) Field of Classification Search .......... 257/686, 257/777, E25.006, E25.013, E25.018, E25.021, 257/E25.027, E23.085, E21.614, E23.169–E23.178, 257/620; 438/109, FOR. 368, FOR. 426, 438/613
See application file for complete search history.

(56) References Cited

U.S. PATENT DOCUMENTS

| | | | |
|---|---|---|---|
| 5,032,896 A | 7/1991 | Little et al. | |
| 5,059,899 A | 10/1991 | Farnworth et al. | |
| 5,688,721 A | 11/1997 | Johnson | |
| 5,883,430 A * | 3/1999 | Johnson | 257/706 |
| 5,998,292 A | 12/1999 | Black et al. | |
| 6,064,114 A | 5/2000 | Higgins, III | |
| 6,175,160 B1 * | 1/2001 | Paniccia et al. | 257/778 |
| 6,235,554 B1 | 5/2001 | Akram et al. | |
| 6,391,685 B1 | 5/2002 | Hikita et al. | |
| 6,429,509 B1 | 8/2002 | Hsuan | |
| 6,476,476 B1 | 11/2002 | Glenn | |

(Continued)

FOREIGN PATENT DOCUMENTS

JP 10-223833 8/1998
(Continued)

OTHER PUBLICATIONS

English language abstract of Japanese Publication No. 2004-071838.
(Continued)

*Primary Examiner* — David Vu
*Assistant Examiner* — Jonathan Han
(74) *Attorney, Agent, or Firm* — Muir Patent Consulting, PLLC (57) ABSTRACT

Provided are a high I/O semiconductor chip package in which a processor and a memory device are connected to each other via through electrodes and a method of manufacturing the high I/O semiconductor chip package. The high I/O semiconductor chip package includes: a substrate comprising a plurality of first circuit patterns on a first surface and a plurality of second circuit patterns on a second surface; a first semiconductor chip comprising a plurality of memory devices arranged on the substrate, each memory device being arranged in a matrix in chip regions partitioned by a scribe region; a second semiconductor chip stacked on the first semiconductor chip; and a plurality of through electrodes arranged along peripheral portions of the memory devices and connecting the first and second semiconductor chips to the second circuit patterns of the substrate.

27 Claims, 10 Drawing Sheets

U.S. PATENT DOCUMENTS

| | | |
|---|---|---|
| 6,734,084 B1 | 5/2004 | Nemoto et al. |
| 6,766,998 B2 | 7/2004 | Silverbrook |
| 6,908,784 B1 | 6/2005 | Farnworth et al. |
| 7,074,703 B2 | 7/2006 | Fukazawa |
| 7,537,959 B2 | 5/2009 | Lee et al. |
| 2002/0025603 A1 | 2/2002 | Ondricek et al. |
| 2002/0074668 A1* | 6/2002 | Hofstee et al. ............. 257/777 |
| 2004/0018667 A1 | 1/2004 | Joshi et al. |
| 2004/0135231 A1 | 7/2004 | Keller et al. |
| 2005/0019965 A1 | 1/2005 | Chao et al. |
| 2005/0051883 A1 | 3/2005 | Fukazawa |
| 2005/0161794 A1* | 7/2005 | Kato et al. ............. 257/686 |
| 2005/0269684 A1* | 12/2005 | Baek et al. ............. 257/691 |
| 2007/0023887 A1* | 2/2007 | Matsui ............. 257/686 |
| 2009/0209063 A1 | 8/2009 | Lee et al. |

FOREIGN PATENT DOCUMENTS

| | | |
|---|---|---|
| JP | 2001-053218 | 2/2001 |
| JP | 2001-093869 | 4/2001 |
| JP | 2001-210782 | 8/2001 |
| JP | 2001-223469 | 8/2001 |
| JP | 2002-016212 | 1/2002 |
| JP | 2002-110897 | 4/2002 |
| JP | 2002-170904 | 6/2002 |
| JP | 2003-163326 | 6/2003 |
| JP | 2004-071838 | 3/2004 |
| JP | 2005-026582 | 1/2005 |
| KR | 10-2000-0067291 | 11/2000 |
| KR | 10-2001-0001159 | 1/2001 |
| KR | 10-2001-0018694 | 3/2001 |
| KR | 2002-0012061 | 2/2002 |
| KR | 10-2003-0023040 | 3/2003 |
| KR | 2005-0074793 | 7/2005 |

OTHER PUBLICATIONS

English language abstract of Korean Publication No. 2005-0074793.

Office Action dated Apr. 13, 2010, Issued in Japanese Application No. 2004-242970.

* cited by examiner

HIGH I/O SEMICONDUCTOR CHIP PACKAGE AND METHOD OF MANUFACTURING THE SAME

CROSS-REFERENCE TO RELATED PATENT APPLICATION

This application claims priority under 35 USC §119 to Korean Patent Application No. 10-2006-0122588, filed on Dec. 5, 2006 in the Korean Intellectual Property Office, the disclosure of which is incorporated herein in its entirety by reference.

BACKGROUND

1. Technical Field

The present invention relates to a semiconductor package, and more particularly, to a high input/output (I/O) semiconductor chip package including a memory chip and a processor chip that are connected to each other via through electrodes arranged on a scribe region, and a method of manufacturing the high I/O semiconductor chip package.

2. Description of the Related Art

A high performance processor such as a CPU or an MPU requires a memory device to/from which a large amount of data can be written/read at high speed; for example, a cache memory device. In a conventional memory device such as a DRAM, data is read from or written to the memory device by passing through wires on a system board. In this case, the ratio of the data writing/reading time to the data processing time is gradually increased, thereby decreasing the processing time of the whole system/processor. In addition, a large system space is required for a memory device and a processor, and design rules and the length of wires are increased. The increase in the length of wires causes increase in the power consumption of input/output power in order to maintain data integrity. In particular, in the case of using a CPU as a processor, data needs to pass through a controller, and thus the above problems are exacerbated. The present invention addresses these and other disadvantages of the conventional art.

SUMMARY

The present invention provides a high I/O semiconductor chip package capable of processing data at high speed, in which a memory chip and a processor chip are connected to each other via through electrodes arranged in a scribe region of the memory chip, and a method of manufacturing the high I/O semiconductor chip package.

According to an aspect of the present invention, there is provided a high I/O semiconductor chip package. The high I/O semiconductor chip package comprises: a substrate, a first semiconductor chip, a second semiconductor chip, and a plurality of through electrodes. The substrate comprises a plurality of first circuit patterns on a first surface and a plurality of second circuit patterns on a second surface. The first semiconductor chip comprises a plurality of memory devices arranged on the substrate, each memory device being arranged in an m×n matrix (where m is an integer equal to or greater than 1 and n is an integer equal to or greater than 2) in chip regions partitioned by a scribe region. The second semiconductor chip has a size corresponding to the first semiconductor chip and is stacked on the first semiconductor chip. The second semiconductor chip may have a size of about 70 to about 120% of the size of the first semiconductor chip. The through electrodes are arranged along peripheral portions of the memory devices and connect the first and second semiconductor chips to the second circuit patterns of the substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. In the drawings, the form of elements may be exaggerated for clarity. Like reference numerals throughout the specification denote like elements.

Figure 1A:
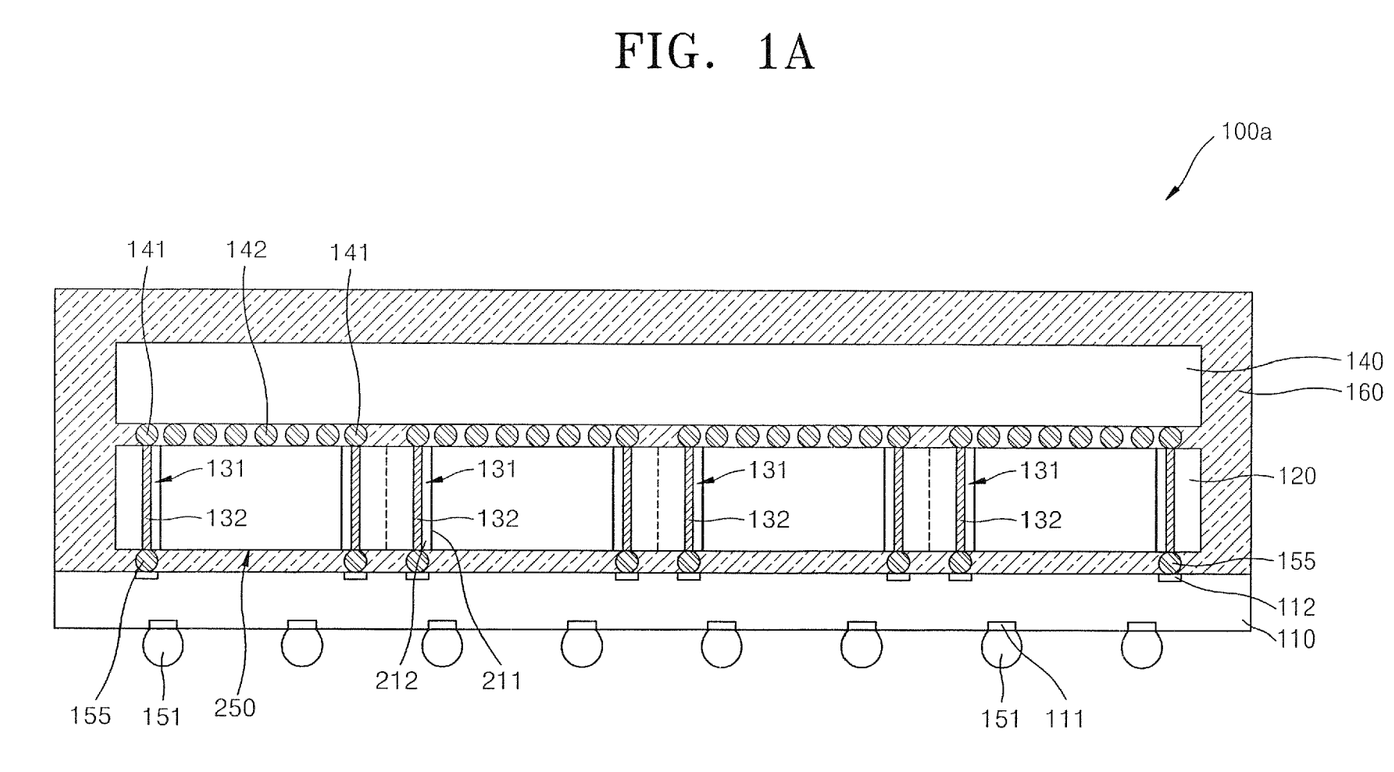
FIGS. 1A and 1B are cross-sectional views illustrating high I/O semiconductor chip packages according to an embodiment of the present invention.
Figure 1B:
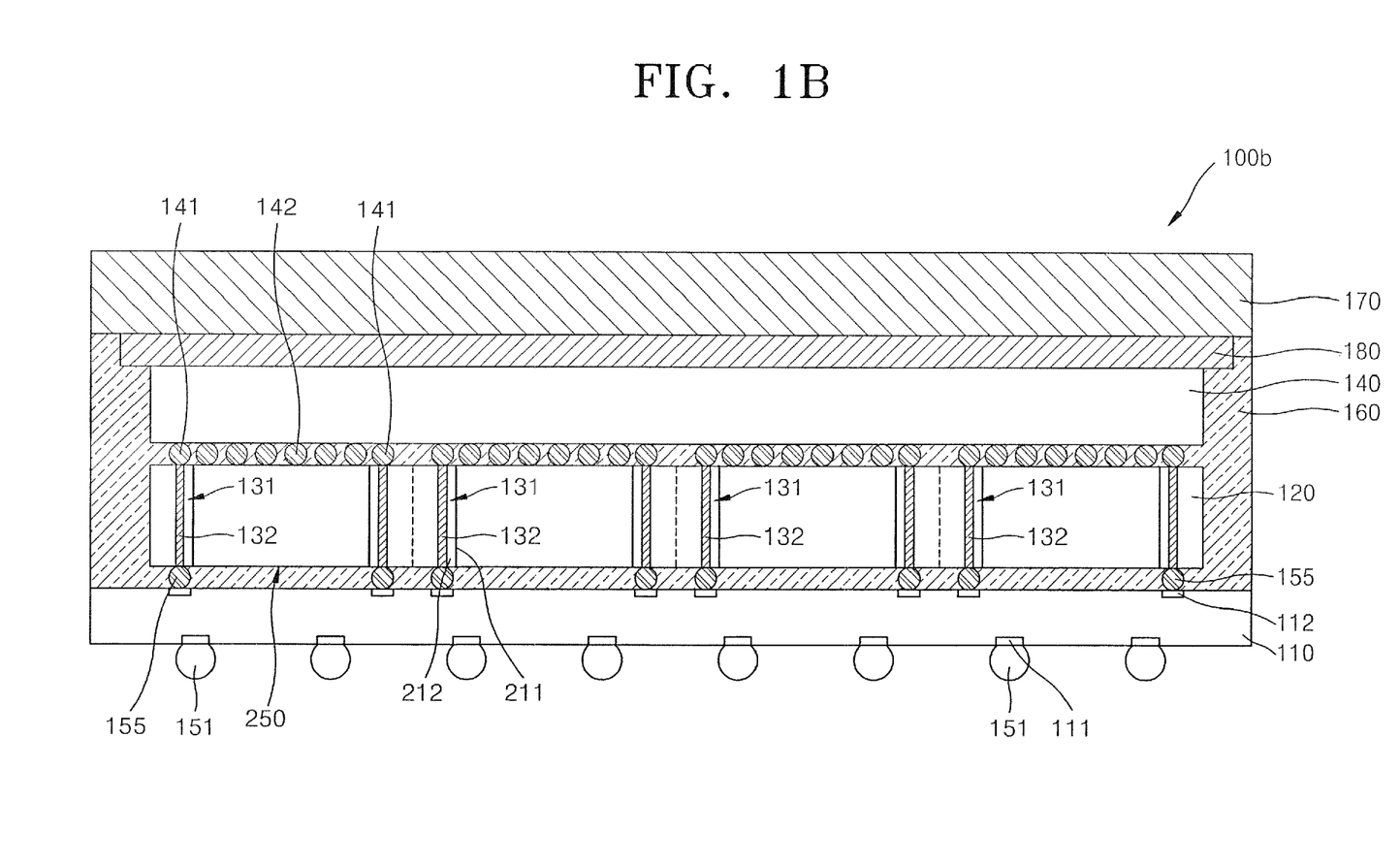

FIGS. 1A and 1B are cross-sectional views of high I/O semiconductor chip packages 100a and 100b according to an embodiment of the present invention. Referring to FIGS. 1A and 1B, each of the high I/O semiconductor chip packages 100a and 100b includes a substrate 110, a first semiconductor chip 120, and a second semiconductor chip 140. The substrate 110 may include a print circuit board and may have a first surface and a second surface, the second surface disposed on an opposite side of the substrate from the first surface. A plurality of first circuit patterns 111 are arranged on a first surface of the substrate 110, and a plurality of second circuit patterns 112 are arranged on a second surface of the substrate 110. The first circuit patterns 111 and the second circuit patterns 112 can be electrically connected to one another through circuit wiring (not shown) arranged on the substrate 110. External contact terminals 151 are arranged on the first circuit pattern 111. The external contact terminals 151 may include solder balls.

Figure 2:
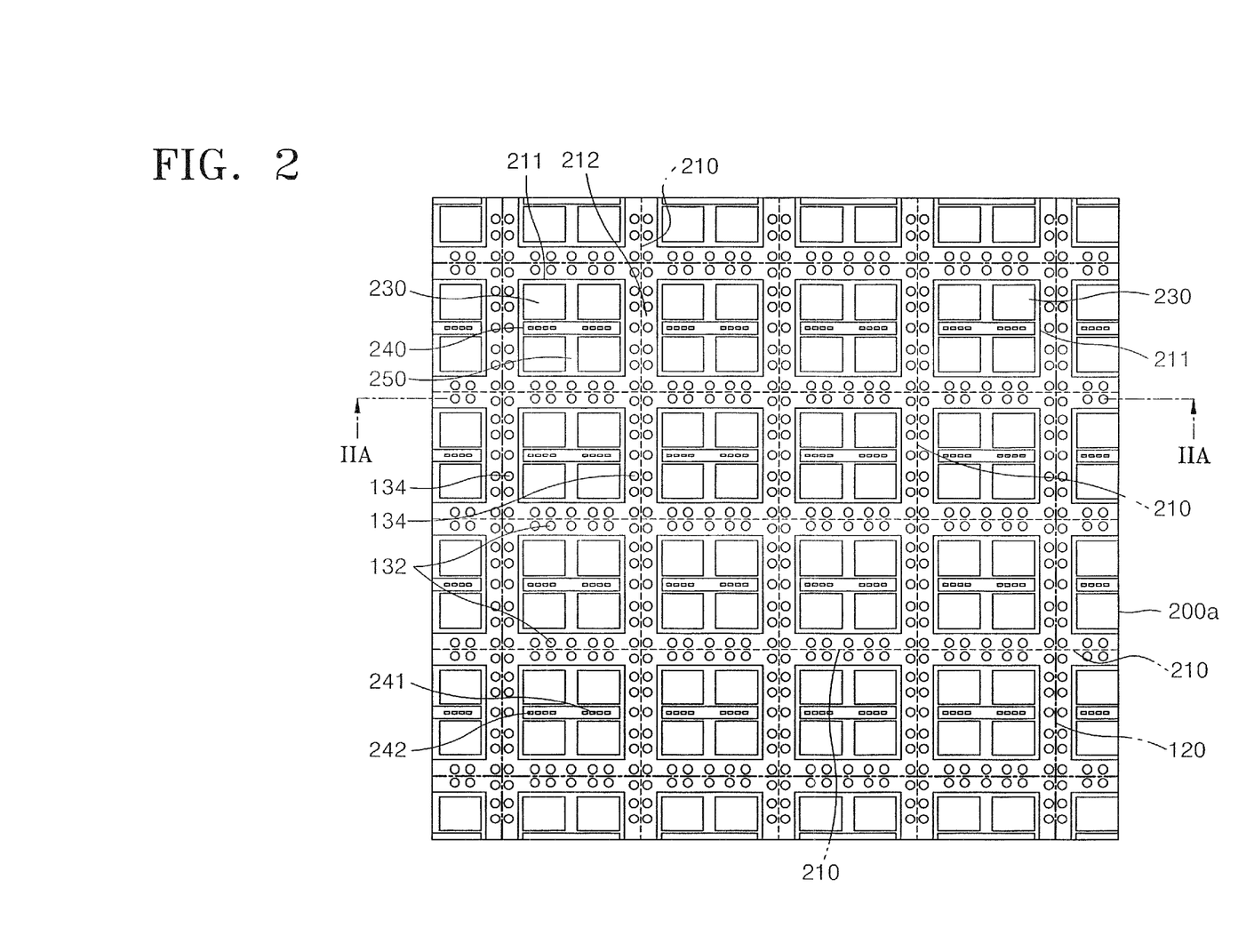
FIG. 2 is a plan view illustrating a first semiconductor chip of the high I/O semiconductor chip packages of FIGS. 1A and 1B.

The first semiconductor chip 120 may include multiple planar semiconductor chips. Referring to FIG. 2, the first semiconductor chip 120 includes a wafer 200a, a plurality of memory devices 250, and the plurality of first and second through electrodes 132 and 134. A plurality of chip regions 211 partitioned by a scribe region 212 are arranged in an m×n matrix (where m is an integer equal to or greater than 1 and n is an integer equal to or greater than 2) on the wafer 200a, and a plurality of memory devices 250 are formed on the chip regions 211. For example, the first semiconductor chip 120 may include a 4×4 matrix of memory devices 250. The memory devices 250 may include DRAMs, SRAMs, or flash memory devices. The wafer 200a is sawed along a scribe line 210.

In the scribe region 212, a plurality of first and second through holes 131 and 133 are arranged around the memory devices 250, and first and second through electrodes 132 and 134 are arranged in the first and second through holes 131 and 133. The through electrodes 132 and 134 are arranged in parallel to each other corresponding to adjacent memory devices 250, with the scribe line 210 therebetween. The memory devices 250 include a plurality of memory cell arrays 230 and a pad portion 240. A plurality of memory cells (not shown) are arranged in the memory cell array 230, and a plurality of first pads 241 and a plurality of second pads 242 are arranged in the pad portion 240. The first pads 241 are connected to a first redistribution line (251 in FIG. 3B), and the second pads 242 are connected to a second redistribution line (252 in FIG. 3A). The arrangement of the memory cell arrays 230 and the pad portions 240 in the memory devices 250 can be modified in various manners. The first and second through electrodes 132 and 134 can be arranged so as to minimize the length of wiring lines.

The first and second through electrodes 132 and 134 are electrically connected to the second circuit patterns 112 of the substrate 110 via third contact terminals 155. The second semiconductor chip 140 is bonded face-to-face to the semiconductor chip 120 via first and second contact terminals 141 and 142. In other words, the first and second semiconductor chips 120 and 140 are bonded such that active surfaces of each of the first and second semiconductor chips 120 and 140 face each other. The second semiconductor chip 140 may have a size corresponding to the first semiconductor chip 120. For example, the second semiconductor chip 140 may have a size of about 70 to about 120% of the size of the first semiconductor chip 120. The second semiconductor chip 140 may include a processor such as a CPU, an MPU or a controller. The first and second semiconductor chips 120 and 140 are electrically connected via the second contact terminals 142. The second semiconductor chip 140 is electrically connected to the second circuit patterns 112 of the substrate 110 via the first through electrodes 132. The first semiconductor chip 120 is electrically connected to the second circuit patterns 112 of the substrate 110 via the second through electrodes 134. Though not shown, the second through holes and electrodes 133 and 134 may be formed under the second pad 242 in the pad portion 240 so that the second pad 242 can be directly connected to the second through electrodes 134 without the second redistribution line 252. The first through third contact terminals 141, 142, and 155 may include solder balls. The first and second through electrodes 132 and 134 may include copper. The first and second through electrodes 132 and 134 may be directly connected to the second circuit patterns 112 of the substrate 110. In other words, the third contact terminals 155 may not be required to connect the first and second through electrodes 132 and 134 to the second circuit patterns 112 of the substrate 110.

The first semiconductor chip 120, the second semiconductor chip 140, and the contact terminals 141, 142, and 155 are coated for protection using a sealing material 160. The sealing material 160 may be consisted of underfill material and/or EMC material. The sealing material 160 may be coated such that the top surface of the second semiconductor chip 140 is exposed. A heat sink 170 may be attached above the second semiconductor chip 140 using an adhesive agent 180. The heat sink 170 is for radiating heat from the second semiconductor chip 140, which is a high speed/high performance processor chip such as a CPU, and may include a metal frame, a metal thermal interface material, or a heating pipe. The sealing material 160 may be formed only around the contact terminals 141, 142, and 155.

Figure 3A:
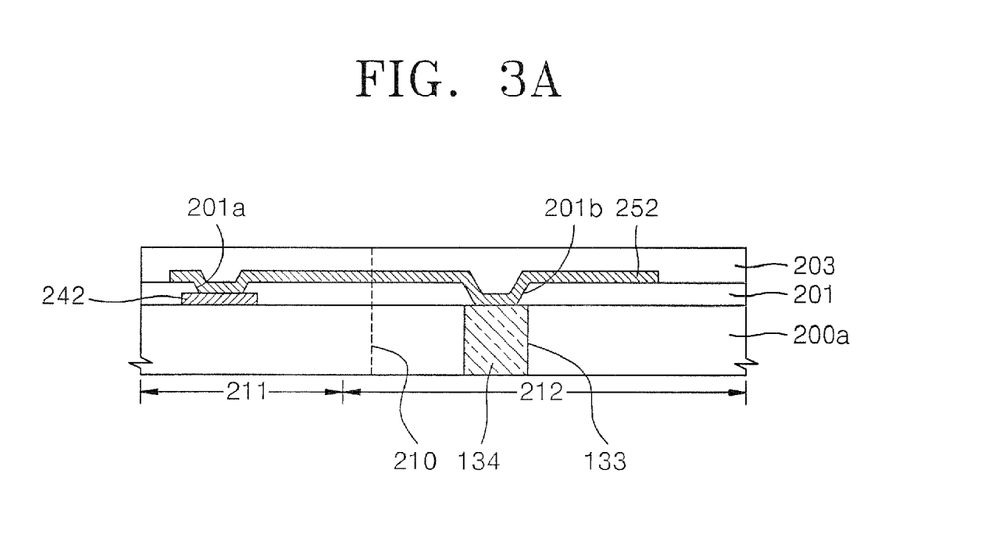
FIG. 3A is a cross-sectional view illustrating the connection between the first semiconductor chip and a substrate via a through electrode of FIG. 2.
Figure 3B:
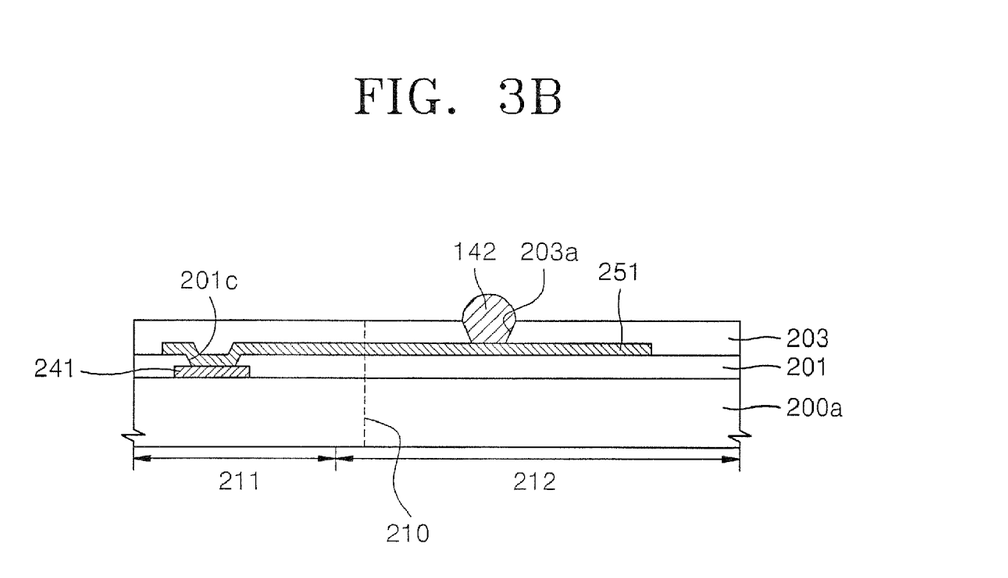
FIG. 3B is a cross-sectional view illustrating the connection between the first semiconductor chip and a second semiconductor chip of FIG. 2.
Figure 3C:
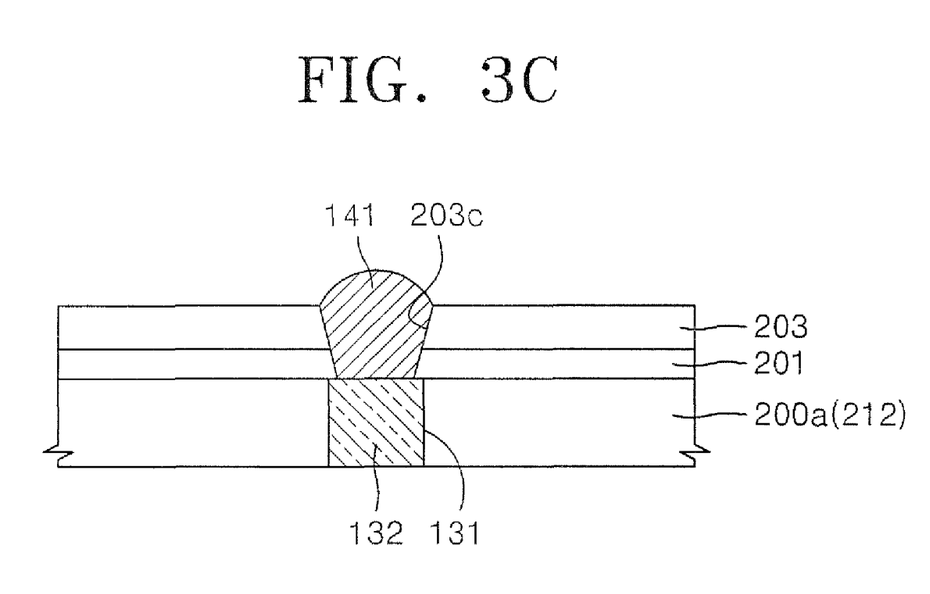
FIG. 3C is a cross-sectional view illustrating the connection between the second semiconductor chip and the substrate via the through electrode of FIG. 2.

FIGS. 3A through 3C are cross-sectional views of the high I/O semiconductor chip packages 100a and 100b, illustrating the connection between the first and second semiconductor chips 120 and 140 and the first and second through electrodes 132 and 134. Referring to FIG. 3A, a second through hole 133 is formed on the scribe region 212 of the wafer 200a, and the second through electrode 134 is formed in the second through hole 133. A second pad 242 is formed on the chip region 211. A first insulating layer 201 including opening portions 201a and 201b exposing portions of the second pad 242 and the second through electrode 134 is formed on the wafer 200a. A second redistribution line 252 is formed on the first insulating layer 201 by a redistribution process, thereby connecting the second pad 242 and the second through electrode 134 electrically via the opening portions 201a and 201b. A second insulating layer 203 is formed on the second redistribution line 252 and the first insulating layer 201. A power voltage, for example, VDD, and a ground voltage, for example, VSS, are provided from the outside to the second pad 242 of the first semiconductor chip 120 via the substrate 110, the second through electrode 134, and the second redistribution line 252. An insulating layer (not shown) may be formed on inner walls of the second through hole 133 to electrically insulate the wafer 200a from the second through electrode 134.

Referring to FIG. 3B, a first pad 241 is formed on the chip region 211 of the wafer 200a. A first insulating layer 201 comprising an opening portion 201c exposing a portion of the first pad 241 is formed on the wafer 200a. A first redistribution line 251 is formed on the first insulating layer 201 by a redistribution process so as to be connected to the first pad 241 via the opening portion 201c. A second insulating layer 203 is formed on the first redistribution line 251 and the first insulating layer 201. The second insulating layer 203 includes an opening portion 203a exposing a portion of the first redistribution line 251. The second contact terminal 142 is arranged on the first redistribution line 251 exposed by the opening portion 203a to electrically connect the first pad 241 and the second contact terminal 142 via the first redistribution line 251. Accordingly, data can be written to and read from the second semiconductor chip 140 to the first semiconductor chip 120 without passing through the substrate 110.

Referring to FIG. 3C, a first through hole 131 is formed on the scribe region 212 of the wafer 200a and the first through electrode 132 is formed in the first through hole 131. The first and second insulating layers 201 and 203 are formed on the wafer 200a such that a portion of the first through electrode 132 is exposed by an opening portion 203c. A first contact terminal 141 is arranged on the first through electrode 132 exposed by the opening portion 203c. A processor data signal to or from the outside, or a processor voltage signal from the outside, for example, a power voltage VDD and a ground voltage VSS, are provided to the second semiconductor chip 140 via the substrate 110 and the first through electrode 132. An insulating layer (not shown) may be formed on inner walls of the first through hole 131 to electrically insulate the wafer 200a from the first through electrode 132.

Though not illustrated in the drawings, the first through electrode 132 and the second semiconductor chip 140 can be connected to each other by a redistribution process. A first through hole 131 is formed in the scribe region 212, and the first insulating layer 201 including an opening portion exposing a portion of the first through hole 131 is formed on the wafer 200a. A redistribution line is formed on the first insulating layer 201 and a second insulating layer 203 including an opening portion exposing a portion of the redistribution line is formed on the first insulating layer 201. Contact terminals 141 are arranged on the redistribution line exposed by the opening portion.

Though not illustrated in the drawings, a processor voltage signal from the outside, for example, a same power voltage-level VDD and a ground voltage VSS, may be provided to the second semiconductor chip 140 via the substrate 110 and sharing some of the second through electrode 134 with additional contact terminals on the second redistribution line 252.

Also, the second semiconductor chip 140 is bonded and stacked on the first semiconductor chip 120 via the first and second contact terminals 141 and 142, and thus stress due to the difference of a coefficient of thermal expansion (CTE) between the first and second semiconductor chips 120 and 140 can be reduced.

Figure 4A:
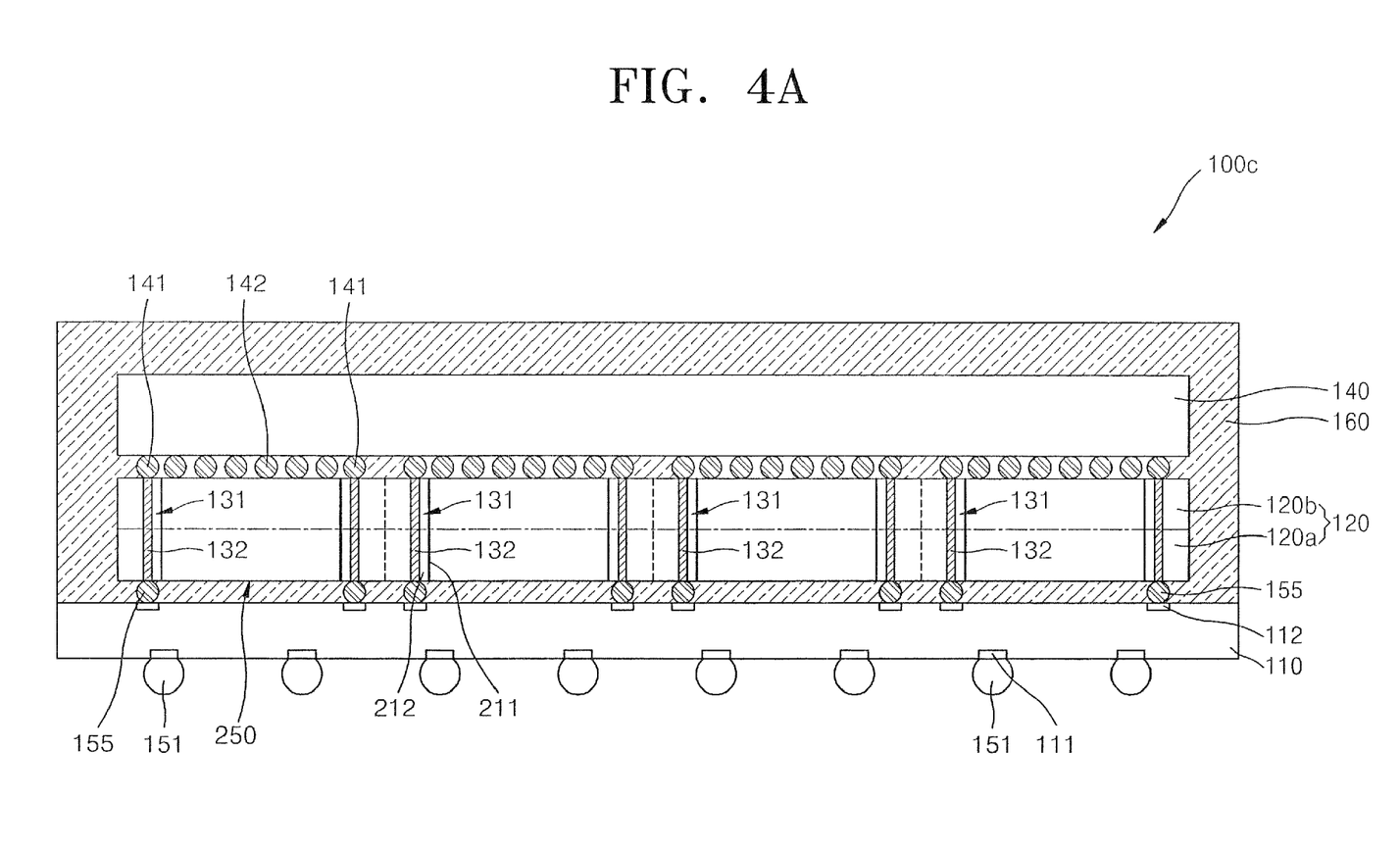
FIGS. 4A and 4B are cross-sectional views illustrating high I/O semiconductor chip packages according to another embodiment of the present invention.
Figure 4B:
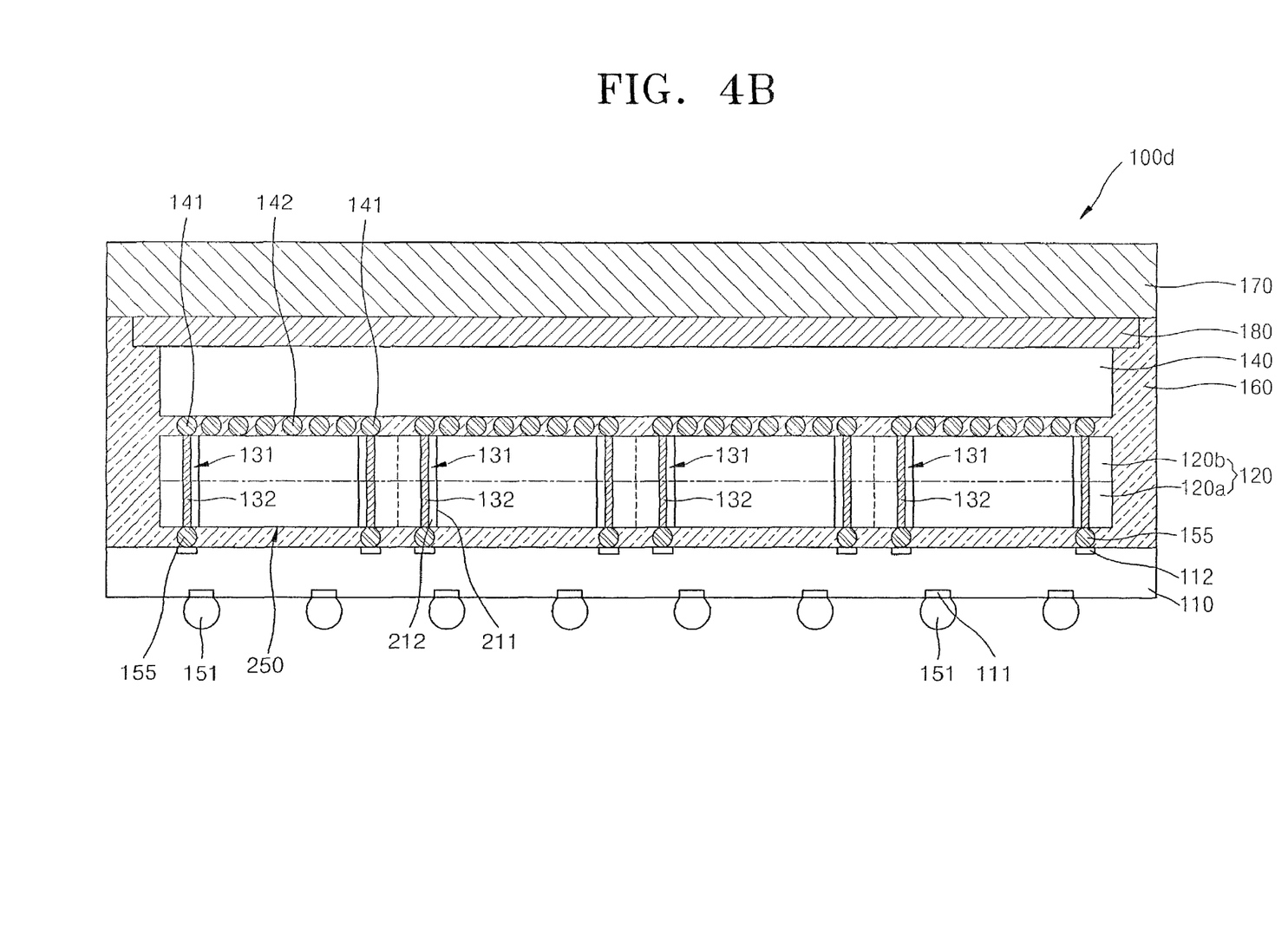

FIGS. 4A and 4B are cross-sectional views of high I/O semiconductor chip packages 100c and 100d in which a memory chip and a processor chip are connected to each other via through electrodes according to another embodiment of the present invention. Referring to FIGS. 4A and 4B, the high I/O semiconductor chip packages 100c and 100d differ from the high I/O semiconductor chip packages 100a and 100b only in that a plurality of semiconductor chips are stacked as a first semiconductor chip 120. The first semiconductor chip 120 includes a lower planar multi semiconductor chip 120a and an upper planar multi semiconductor chip 120b. The high I/O semiconductor chip packages 100c and 100d further require through electrodes that electrically connect the lower planar multi semiconductor chip 120a and the second semiconductor chip 140 to enable data writing and reading. In the lower planar multi semiconductor chip 120a, through holes may be further formed in the chip regions 211 corresponding to the second pads 242 and the first pads 241 of the memory devices 250, and through electrodes may be further arranged in the through holes.

Figure 5A:
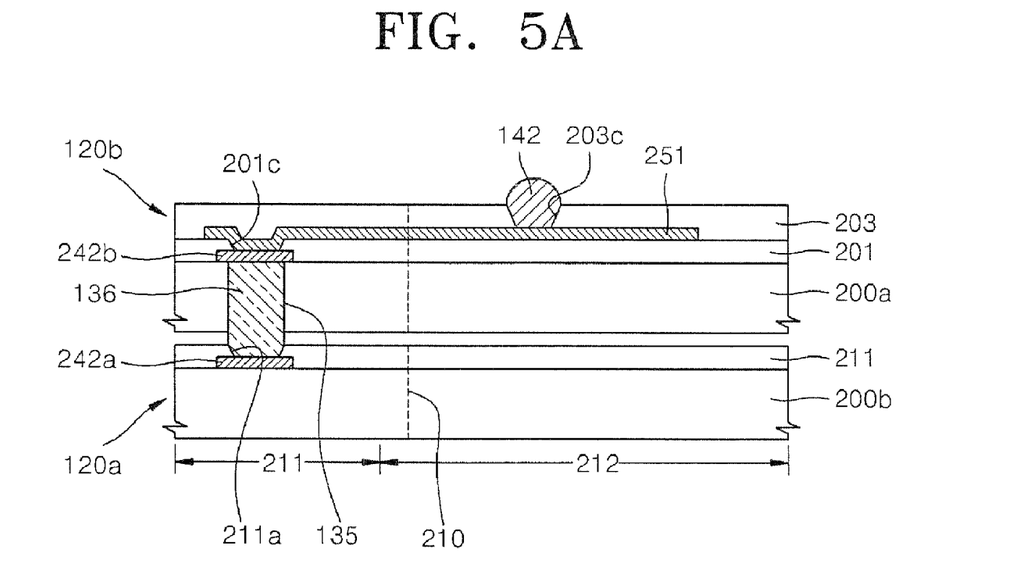
FIGS. 5A and 5B are cross-sectional views illustrating the connection between a lower planar multi semiconductor chip of a first semiconductor chip and a second semiconductor chip via a through electrode of FIGS. 4A and 4B.
Figure 5B:
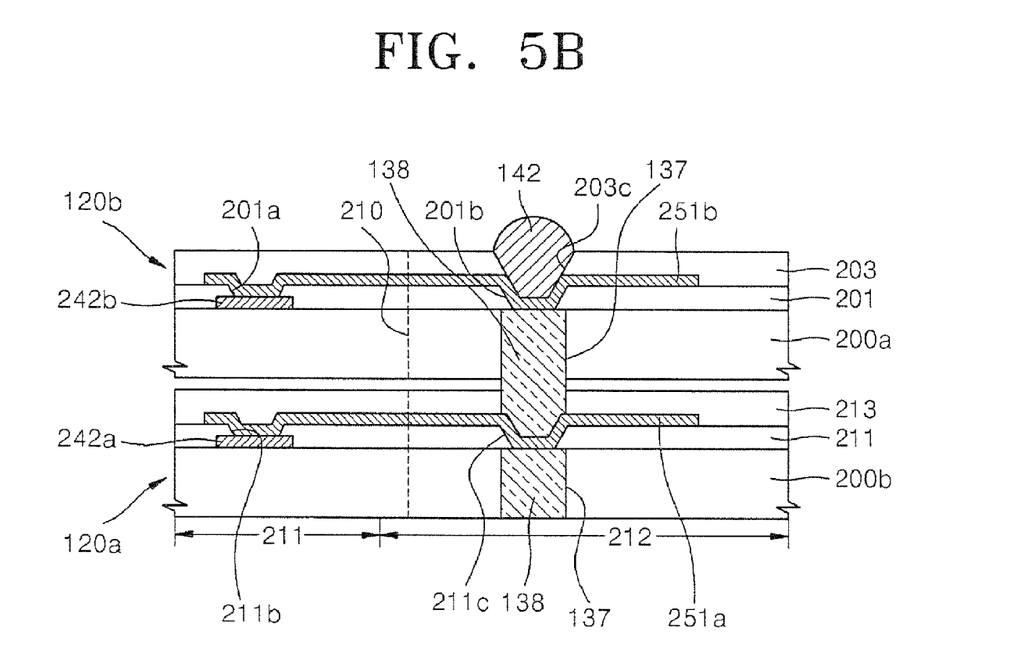

FIGS. 5A and 5B are cross-sectional views illustrating the connection between a lower planar multi semiconductor chip of a first semiconductor chip and a second semiconductor chip via a through electrode of FIGS. 4A and 4B.

Referring to FIG. 5A, in the upper planar multi semiconductor chip 120b, a third through hole 135 is formed in the chip region 211 of the memory device 250 corresponding to the first pads 241b and a third through electrode 136 is formed in the third through hole 135. Accordingly, the lower planar multi semiconductor chip 120a and the second semiconductor chip 140 are electrically connected via the third through electrode 136 formed in the third through hole 135. In other words, data is written to and read from the second semiconductor chip 140 from the first pad 241a of the lower planar multi semiconductor chip 120a via the third through electrode 136 of the upper planar multi semiconductor chip 120b and the first pad 241b and the first redistribution line 251. In this case, the third through electrode 136 connected to the first pad 241a of the lower planar multi semiconductor chip 120a is not connected to the substrate 110. The first pads 241b and 241a of the upper planar multi semiconductor chip 120b and the lower planar multi semiconductor chip 120a are connected to the second semiconductor chip 140 via the third through electrode 136 at the same time, and thus an additional selection/controlling pin (not shown) may be used to operate the upper planar multi semiconductor chip 120b and the lower planar multi semiconductor chip 120a.

Referring to FIG. 5B, a fourth through hole 137 is formed under the second contact terminal 142 in the scribe region 212 of the lower and upper planar multi semiconductor chips 120a and 120b, and a fourth through electrode 138 is formed in the fourth through hole 137. The first pad 241a of the lower planar multi semiconductor chip 120a and the first pad 241b of the upper planar multi semiconductor chip 120b are connected to the fourth through electrodes 138 arranged in the fourth through hole 137 via first redistribution lines 251a and 251 b, respectively, to be electrically connected to the second semiconductor chip 140. Accordingly, data is written and read between the lower and upper multi semiconductor chips 120a and 120b and the second semiconductor chip 140. In this case, the fourth through electrode 138 connected to the second contact terminal 142 is not connected to the substrate 110, and an additional selection/controlling pin (not shown) may be used to operate the upper planar multi semiconductor chip 120b and the lower planar multi semiconductor chip 120a.

Voltage signals can be provided to second pads 242a and 242b of the lower and upper planar multi semiconductor chips 120a and 120b in the same manner as described with reference to FIGS. 3A and 3C. The lower and upper planar multi semiconductor chips 120a and 120b have the same structure as those of FIGS. 2 and 3A through 3C. The through electrodes 132 and 134 of the lower and upper multi semiconductor chips 120a and 120b contact one another directly or via contact terminals or an isotropic conductive film (not shown). Three or more semiconductor chips may also be stacked in the same manner. The connection structures illustrated in FIGS. 5A and 5B can be modified in various manners. As an example, third through holes 135 may also be formed under the second pads 242a of the lower planar multi semiconductor chip 120a and third through electrodes 136 may be formed in the third through holes 135. Processor data and voltage signals can be linked to or from the outside in the same manner as described with reference to FIG. 3C. The multi-connected first through electrodes 132 are connected to the second semiconductor chip 140 via the first contact terminals 141.

Figure 6:
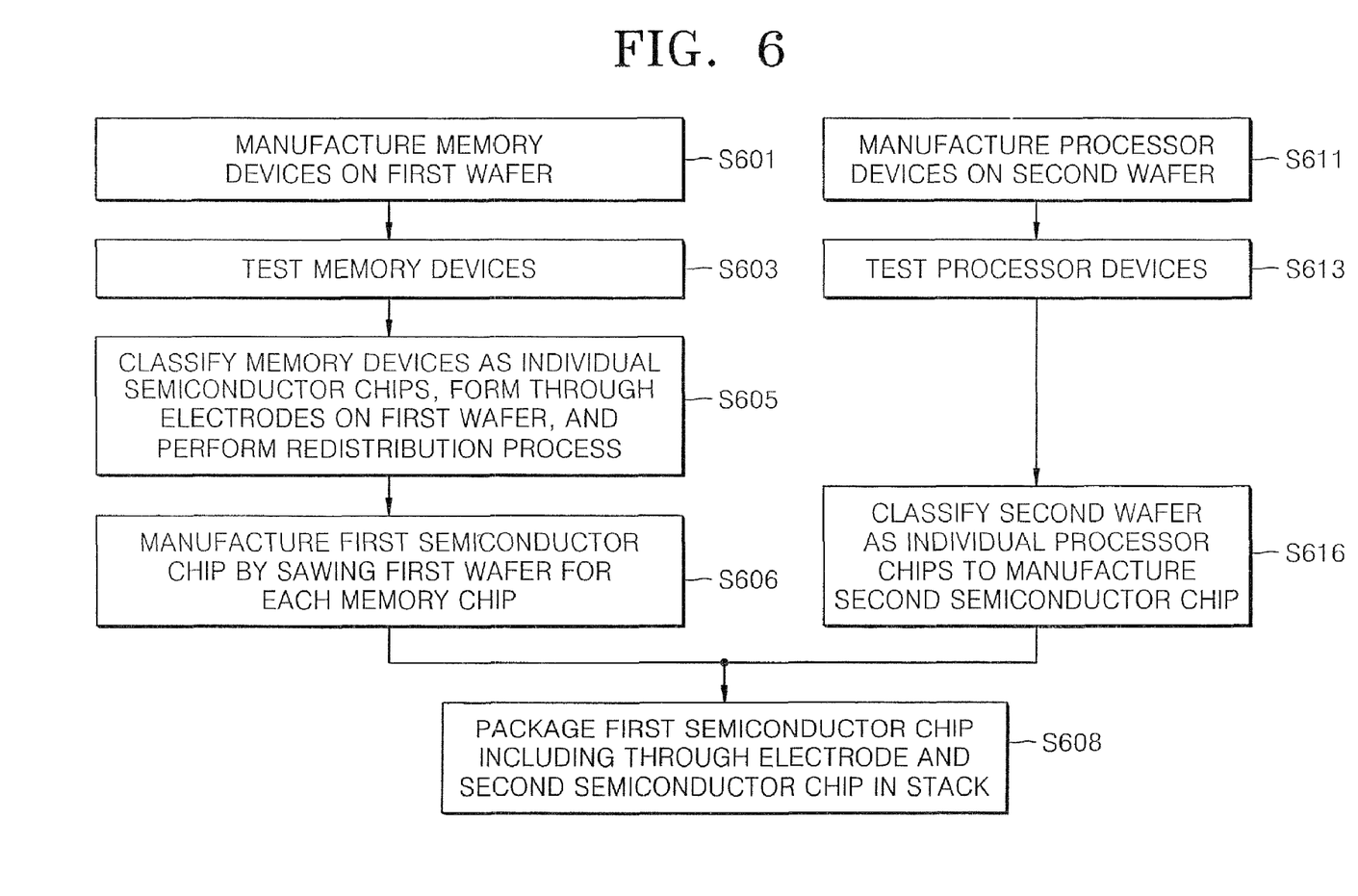
FIG. 6 is a flow chart of a method of manufacturing a high I/O semiconductor chip package according to an embodiment of the present invention.
Figure 7:
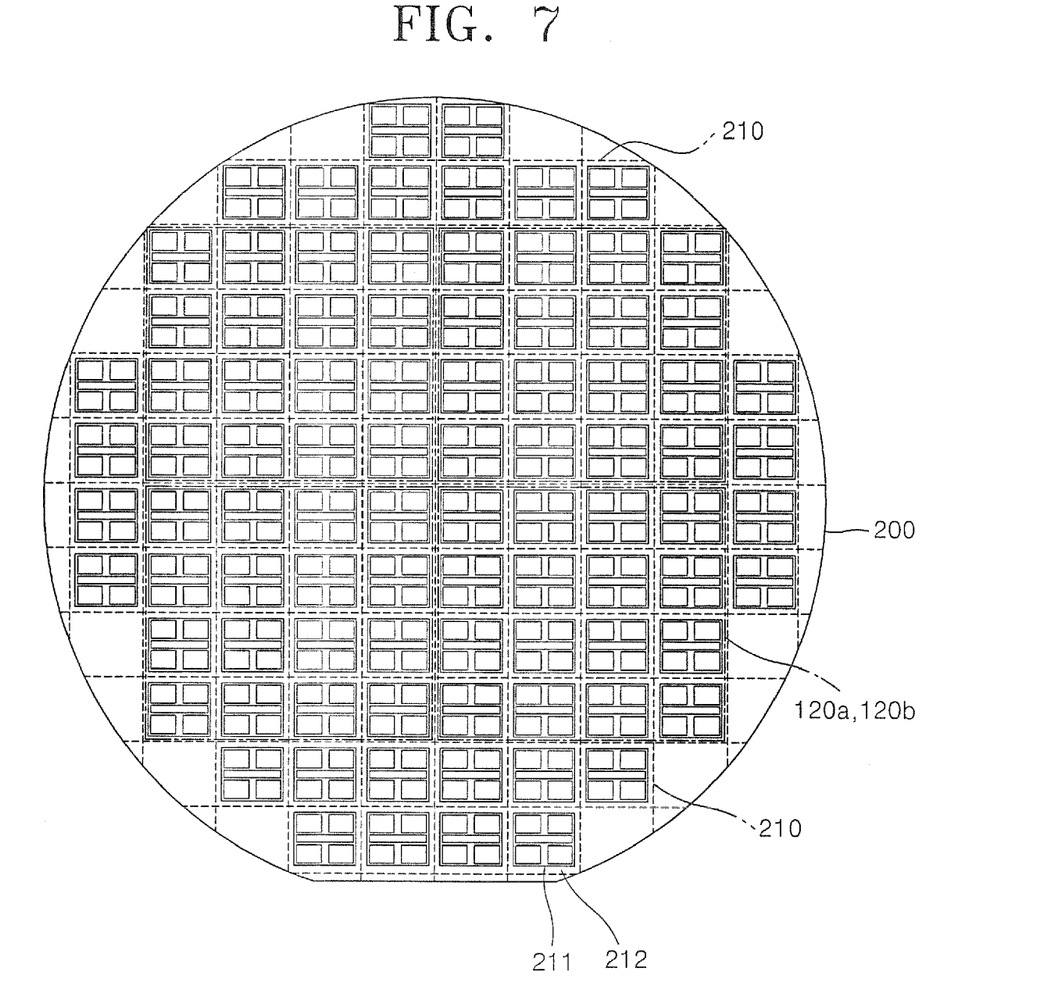
FIG. 7 is a plan view illustrating a semiconductor wafer for explaining a method of sawing a semiconductor wafer during the manufacturing process of the high I/O semiconductor chip package of FIG. 6 according to an embodiment of the present invention.

FIG. 6 is a flowchart of a method of manufacturing the high I/O semiconductor chip packages 100a and 100b according to an embodiment of the present invention. FIG. 7 is a plan view illustrating a semiconductor wafer for explaining a method of sawing a semiconductor wafer during the manufacturing process of the high I/O semiconductor chip packages 100a and 100b according to an embodiment of the present invention. Referring to FIGS. 6 and 7, in operation S601, a first wafer (200 in FIG. 2) is provided, and memory devices 250 are formed on the first wafer 200 using a semiconductor manufacturing process. In operation S611, a second wafer (not shown) is provided to manufacture a processor device on the second wafer using a semiconductor manufacturing process. In operation S603, the memory device 250 is tested to determine potential defects, and in operation S613, a processor chip is tested to determine potential defects. The memory devices 250 are classified as individual memory chips in an m×n matrix (where m is an integer equal to or greater than 1 and n is an integer equal to or greater than 2) in operation S605. Through holes 131 and 133 are formed in the scribe region 212 along peripheral portions of the memory devices 250 of the memory chip using, for example, a photolithographic etching process. Through electrodes 132 and 134 are formed in the through holes 131 and 133 and a redistribution process is also performed in operation S605. In operation S606, the first wafer 200 is sawed along a scribe line 210 in units of memory chips to manufacture a first semiconductor chip 120.

The second wafer is classified as individual processor chips and sawed along the scribe line in operation S616. Thus a second semiconductor chip 140 is manufactured. In operation S608, the first and second semiconductor chips 120 and 140 are mounted on the substrate 110 to manufacture high I/O semiconductor chip packages 100a and 100b. First, the first semiconductor chip 120 is mounted on the substrate 110 such that the through electrodes 132 and 134 of the first semiconductor chip 120 are electrically connected to the second circuit patterns 112 of the substrate 110, respectively, via the contact terminals 155. The second semiconductor chip 140 is arranged over the first semiconductor chip 120 such that the second semiconductor chip 140 and the first semiconductor chip 120 are electrically connected to each other via the substrate 110 and the contact terminals 141 and 142. The first semiconductor chip 120, the second semiconductor chip 140, and the contact terminals 141 and 142 are coated using a sealing material 160.

A heat sink 170 may be attached above the second semiconductor chip 140 using an adhesive agent 180. The through electrodes 132 and 134 are separated from the chip region 211 in which memory devices are arranged and are instead arranged in the scribe region 212. Thus, the through electrodes 132 and 134 can be formed on the first wafer 200 before or after the manufacturing process of the memory devices, but before the testing process.

According to the present invention, the bandwidth of data transmission can be extended and data can be processed at high speed by mounting a processor chip and a memory chip for storing data of the processor chip in a semiconductor package and by arranging through electrodes in the memory chip to electrically connect the processor chip and the memory chip.

According to an aspect of the present invention, there is provided a high I/O semiconductor chip package. The high I/O semiconductor chip package comprises: a substrate, a first semiconductor chip, a second semiconductor chip, and a plurality of through electrodes. The substrate comprises a plurality of first circuit patterns on a first surface and a plurality of second circuit patterns on a second surface. The first semiconductor chip comprises a plurality of memory devices arranged on the substrate, each memory device being arranged in an m×n matrix (where m is an integer equal to or greater than 1 and n is an integer equal to or greater than 2) in chip regions partitioned by a scribe region. The second semiconductor chip has a size substantially corresponding to the first semiconductor chip and is stacked on the first semiconductor chips. The second semiconductor chip may have a size of about 70 to about 120% of the size of the first semiconductor chip. The through electrodes are arranged along peripheral portions of the memory devices and connect the first and second semiconductor chips to the second circuit patterns of the substrate.

The memory device may comprise a DRAM, an SRAM, or a flash memory device, and the second semiconductor chip may comprise a processor or a controller. The first semiconductor chip and the second semiconductor chip may be bonded to each other in a face-to-face configuration directly or via contact terminals. The through electrodes may be arranged in the scribe region such that the through electrodes are arranged in parallel to each other corresponding to adjacent memory devices, and a scribe line is arranged therebetween.

The memory device may comprise a plurality of first pads and a plurality of second pads, and the through electrodes may comprise a plurality of first and second through electrodes. The first pads may be electrically connected to the second semiconductor chip via first redistribution lines, respectively, and data may be written/read from the second semiconductor chips to/from the first semiconductor chips, and the second pads may be electrically connected to the second through electrodes through second redistribution lines and provide voltage signals from the outside to the first semiconductor chips via the substrate. The first redistribution lines may be connected to the second semiconductor chip via contact terminals. The second semiconductor chip may be electrically connected to the first through electrodes and thus signals from the outside may be provided to the second semiconductor chip via the substrate. The second semiconductor chip and the second through electrodes may be connected to each other via contact terminals.

The first semiconductor chip and the second semiconductor chip may be protected by being coated using a sealing material. A heat sink may be attached above the second semiconductor chip for heat radiation.

In the first semiconductor chip, a plurality of planar multi semiconductor chips may be stacked and the through electrodes may be arranged along a peripheral portion of the memory devices of each of the planar multi semiconductor chips, and the through electrodes of upper and lower planar multi semiconductor chips may contact each other directly or via contact terminals. The memory devices of each planar multi semiconductor chip of the first semiconductor chip may comprise a plurality of first pads and a plurality of second pads, and the memory device may further comprise a plurality of through electrodes for connection arranged under the first pads or the second pads, wherein the lower planar multi semiconductor chips and the second semiconductor chip are electrically connected via the through electrodes. The memory devices of each planar multi semiconductor chip of the first semiconductor chip may comprise a plurality of first pads and a plurality of second pads, and the memory device may further comprise a plurality of through electrodes connected to the first or second pads for connection, and the lower planar multi semiconductor chip and the second semiconductor chip may be electrically connected via the through electrodes.

According to another aspect of the present invention, there is provided a method of manufacturing a high I/O semiconductor chip package. A plurality of memory devices are manufactured on a first wafer, in a plurality of chip regions partitioned by a scribe region including a scribe line, and whether the memory devices include defects is tested. The memory devices are classified as individual memory chips, wherein the memory devices are arranged in an m×n matrix (where m is an integer equal to or greater than 1 and n is an integer equal to or greater than 2) in the memory chip. A plurality of through holes are formed along peripheral portions of the memory devices of the memory chip, a plurality of through electrodes are formed in the through holes, and a redistribution process is performed. The through electrodes may be formed before or after manufacturing the memory device. The forming through electrodes and the redistribution process may be performed at the same time. First semiconductor chips are manufactured by sawing the first wafer in units of memory chips along the scribe line. The first semiconductor chip may include a planar multi semiconductor chip. A plurality of processor devices are manufactured on a second wafer, and whether the processor devices include defects is tested. The second wafer is classified as individual processor chips and sawed to manufacture second semiconductor chips. The first semiconductor chip is mounted on the substrate and the second semiconductor chip is bonded to correspond to the first semiconductor chip in a face-to-face configuration. The first and second semiconductor chips are electrically connected to the substrate via the through electrodes. The first semiconductor chip, the second semiconductor chip, and the substrate are coated using a sealing material.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor chip package comprising:
   a first semiconductor chip having a first memory device and a second memory device adjacent to each other, the first memory device including a first set of terminals dedicated only to the first memory device and the second memory device including a second set of terminals dedicated only to the second memory device, the first set of terminals and the second set of terminals having the same configuration;
   a plurality of first through electrodes arranged along an edge of the first semiconductor chip; and
   a second semiconductor chip disposed on a first surface of the first semiconductor chip.

2. The semiconductor chip package of claim 1, further comprising a substrate having a plurality of circuit patterns, the substrate disposed on a second surface of the first semiconductor chip.

3. The semiconductor chip package of claim 2, wherein a signal is transmitted from the circuit patterns of the substrate to the second semiconductor chip via the first through electrodes.

4. The semiconductor chip package of claim 3, wherein the signal includes at least one of a data signal or a power signal.

5. The semiconductor chip package of claim 4, wherein a redistribution line extends from a first through electrode to either the first memory device or the second memory device for transferring the signal.

6. The semiconductor chip package of claim 2, wherein the circuit patterns of the substrate and respective first ends of the first through electrodes are electrically connected by contact terminals.

7. The semiconductor chip package of claim 1, further comprising a plurality of second through electrodes arranged along an area between two adjacent memory devices.

8. The semiconductor chip package of claim 1, wherein the first semiconductor chip includes a plurality of memory devices arranged in an m×n matrix, wherein m is an integer equal to or greater than 1 and n is an integer equal to or greater than 2.

9. The semiconductor chip package of claim 8, wherein the second semiconductor chip is electrically connected to respective second ends of the first through electrodes by contact terminals.

10. The semiconductor chip package of claim 1, wherein the first and second memory devices comprise one of a DRAM device, an SRAM device, or a flash memory device.

11. The semiconductor chip package of claim 1, wherein the second semiconductor chip comprises one of a processor or a controller.

12. A high I/O semiconductor chip package comprising:
    a substrate having a first surface and a second surface disposed opposite to the first surface, the substrate comprising a plurality of first circuit patterns on the first surface and a plurality of second circuit patterns on the second surface;
    a first semiconductor chip comprising a plurality of memory devices arranged on the substrate, each memory device being arranged in an m×n matrix (where m is an integer equal to or greater than 1 and n is an integer equal to or greater than 2) in chip regions partitioned by a scribe region and comprising a plurality of first pads and a plurality of second pads;
    a second semiconductor chip directly stacked on the first semiconductor chip; and
    a plurality of through electrodes arranged along peripheral portions of the memory devices and comprising first and second through electrodes,
    wherein a first communication path is formed between the first pads of the first semiconductor chip and the second semiconductor chip via first redistribution lines,
    wherein a second communication path is formed between the second pads of the first semiconductor chip and the first circuit patterns of the substrate via the second through electrode and second redistribution lines,
    wherein a third communication path is formed between the second semiconductor chip and the second circuit patterns of the substrate via the first through electrode, and
    wherein the first communication path is not in direct electrical communication with the substrate.

13. The chip package of claim 12, wherein the second communication path is not in communication with the second semiconductor chip.

14. The chip package of claim 12, wherein the third communication path is not in communication with the memory devices of the first semiconductor chip.

15. The chip package of claim 12, wherein each of the first, second and third communication paths consist essentially of an electrical node.

16. The chip package of claim 12, wherein each of the memory devices is configured to operate as an individual memory chip.

17. A high I/O semiconductor chip package comprising:
    a substrate having a first surface and a second surface disposed opposite to the first surface, the substrate comprising a plurality of first circuit patterns on the first surface and a plurality of second circuit patterns on the second surface;
    a first semiconductor chip comprising a plurality of memory devices arranged on the substrate, each memory device being arranged in an m×n matrix (where m is an integer equal to or greater than 1 and n is an integer equal to or greater than 2) in chip regions partitioned by a scribe region and comprising a plurality of first pads and a plurality of second pads;
    a second semiconductor chip directly stacked on the first semiconductor chip; and
    a plurality of through electrodes arranged along peripheral portions of the memory devices and comprising first and second through electrodes, wherein a first communication path is formed between the first pads of the first semiconductor chip and the second semiconductor chip via first redistribution lines, wherein a second communication path is formed between the second pads of the first semiconductor chip and the first circuit patterns of the substrate via the second through electrode and second redistribution lines, wherein a third communication path is formed between the second semiconductor chip and the second circuit patterns of the substrate via the first through electrode, and wherein the second through electrode is dedicated only to providing communications between the second pads of the first semiconductor chip and the first circuit patterns of the substrate, and the first through electrode is dedicated only to providing communications between the second semiconductor chip and the second circuit patterns of the substrate.

18. A semiconductor chip package comprising:
a first semiconductor chip having a first memory device and a second memory device adjacent to each other, the first memory device including a first set of terminals dedicated only to the first memory device and the second memory device including a second set of terminals dedicated only to the second memory device;
a plurality of first through electrodes arranged along an edge of the first semiconductor chip; and
a second semiconductor chip disposed on a first surface of the first semiconductor chip,
wherein each of the first and second memory devices is configured to operate as an individual memory chip.

19. A semiconductor chip package comprising:
a first semiconductor chip having a first memory device and a second memory device adjacent to each other with a scribe region formed therebetween, the first memory device including a first set of terminals dedicated only to the first memory device and the second memory device including a second set of terminals dedicated only to the second memory device;
a plurality of through electrodes arranged at the scribe region of the first semiconductor chip;
a second semiconductor chip disposed on a first surface of the first semiconductor chip; and
a substrate having a plurality of circuit patterns, the substrate disposed on a second surface of the first semiconductor chip,
wherein a portion of the plurality of circuit patterns are electrically connected with the first memory device via the through electrodes and the second semiconductor chip.

20. The semiconductor chip package of claim 19, wherein a signal transmits
from the portion of the circuit patterns of the substrate to the first memory device via the through electrodes and the second semiconductor chip.

21. The semiconductor chip package of claim 20, wherein the signal includes at least one of a data signal or a power signal.

22. The semiconductor chip package of claim 21, wherein a redistribution line
extends from one of the plurality of through electrode to the first memory device for transferring the signal.

23. The semiconductor chip package of claim 20, wherein the circuit patterns of the substrate and respective first ends of the through electrodes are electrically connected by contact terminals.

24. The semiconductor chip package of claim 23, wherein the second semiconductor chip is electrically connected to respective second ends of the first through electrodes by contact terminals.

25. The semiconductor chip package of claim 19, wherein the first semiconductor
chip includes a plurality of memory devices arranged in an m×n matrix, wherein m is an integer equal to or greater than 1 and n is an integer equal to or greater than 2.

26. The semiconductor chip package of claim 19, wherein the first and second
memory devices comprise one of a DRAM device, an SRAM device, or a flash memory device.

27. The semiconductor chip package of claim 19, wherein the second semiconductor chip comprises one of a processor or a controller.

* * * * *